United States Patent [19]

Adler

[11] Patent Number: 4,868,921
[45] Date of Patent: Sep. 19, 1989

[54] HIGH VOLTAGE INTEGRATED CIRCUIT DEVICES ELECTRICALLY ISOLATED FROM AN INTEGRATED CIRCUIT SUBSTRATE

[75] Inventor: Michael S. Adler, Schenectady, N.Y.

[73] Assignee: General Electric Company, Schenectady, N.Y.

[21] Appl. No.: 152,703

[22] Filed: Feb. 5, 1988

Related U.S. Application Data

[63] Continuation of Ser. No. 904,735, Sep. 5, 1986, which is a continuation of Ser. No. 639,042, Aug. 9, 1984, abandoned.

[51] Int. Cl.$^4$ .......................................... H01L 27/02
[52] U.S. Cl. ...................................... 357/43; 357/20; 357/58
[58] Field of Search ........................ 357/22, 43, 58, 20

[56] References Cited

U.S. PATENT DOCUMENTS

| | | | |
|---|---|---|---|
| 4,409,606 | 10/1983 | Wagenaar et al. | 357/43 |
| 4,422,089 | 12/1983 | Vaes et al. | 357/43 |
| 4,494,134 | 1/1985 | Wildi et al. | 357/43 |

FOREIGN PATENT DOCUMENTS 53-67368  6/1978  Japan ...................................... 357/43

Primary Examiner—Joseph E. Clawson, Jr.
Attorney, Agent, or Firm—Robert Ochis; James C. Davis, Jr.; Marvin Snyder

[57] ABSTRACT

An integrated circuit with a substrate of one conductivity type and a drift layer on the substrate of opposite conductivity type includes a high voltage semiconductor device, such as a P-N diode, with a first main device region of the opposite conductivity type adjoining the drift layer and a second main device region of the same conductivity type as the substrate adjoining the drift layer. The high voltage semiconductor device is electrically isolated from other devices through the incorporation into the integrated circuit of an isolation region adjoining the substrate and surrounding the high voltage device. Electrical isolation of the high voltage device from the substrate is achieved by interposing a highly-doped buried layer of the opposite conductivity type between the second main device region and the substrate so as to prevent current carrier injection from the second main device region into the substrate. A field gate is included in the high voltage device, being insulatingly spaced from the drift layer, situated between the buried layer and the first main device region, and electrically shorted to the second main device region. The field gate prevents the buried layer from rising dangerously high in voltage while the device is in a reverse blocking mode by pinching off current flow in the drift layer that would otherwise raise the voltage of the buried layer. Consequently, avalance breakdown between the buried layer and the above-situated second main device region is avoided.

22 Claims, 2 Drawing Sheets

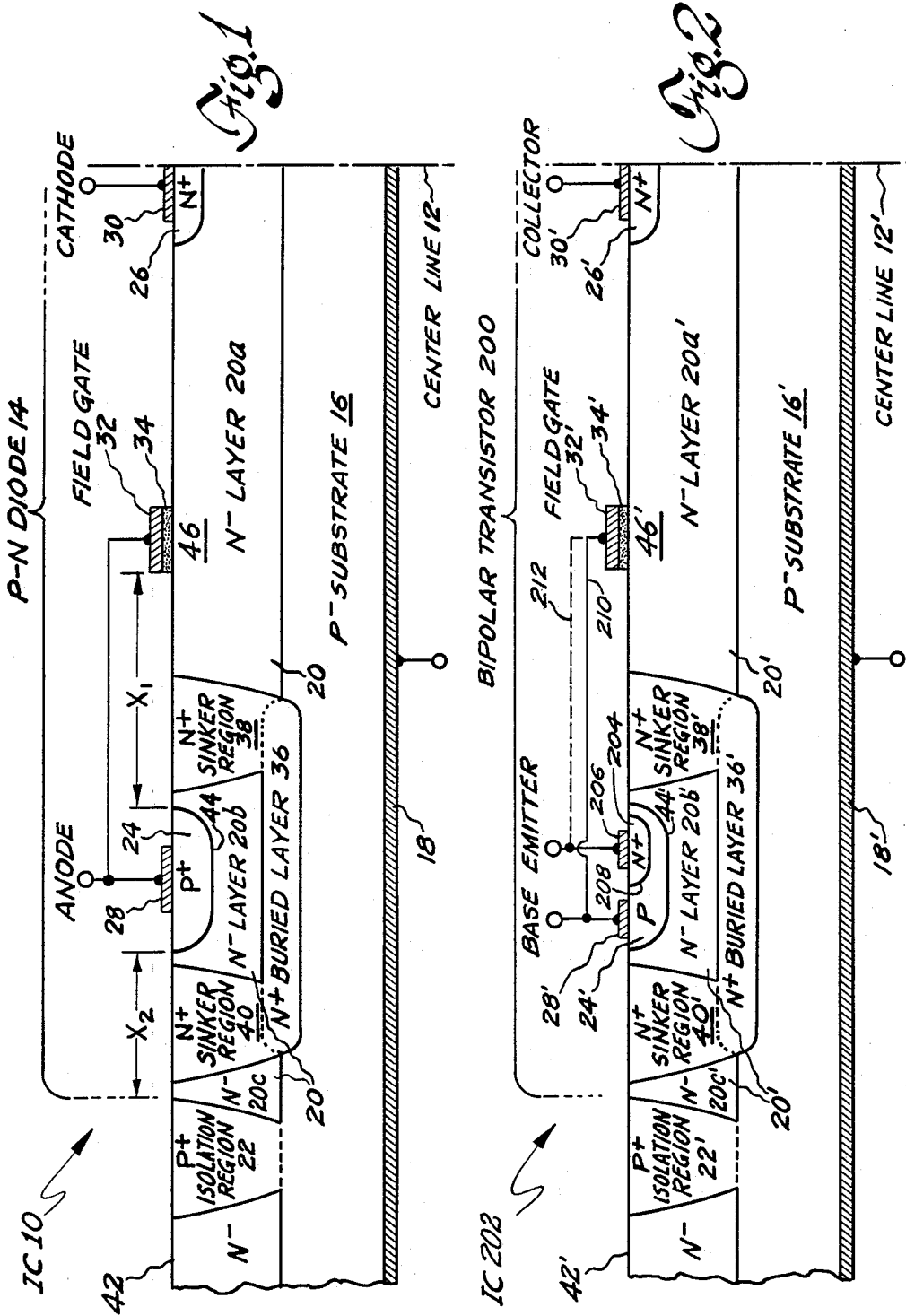

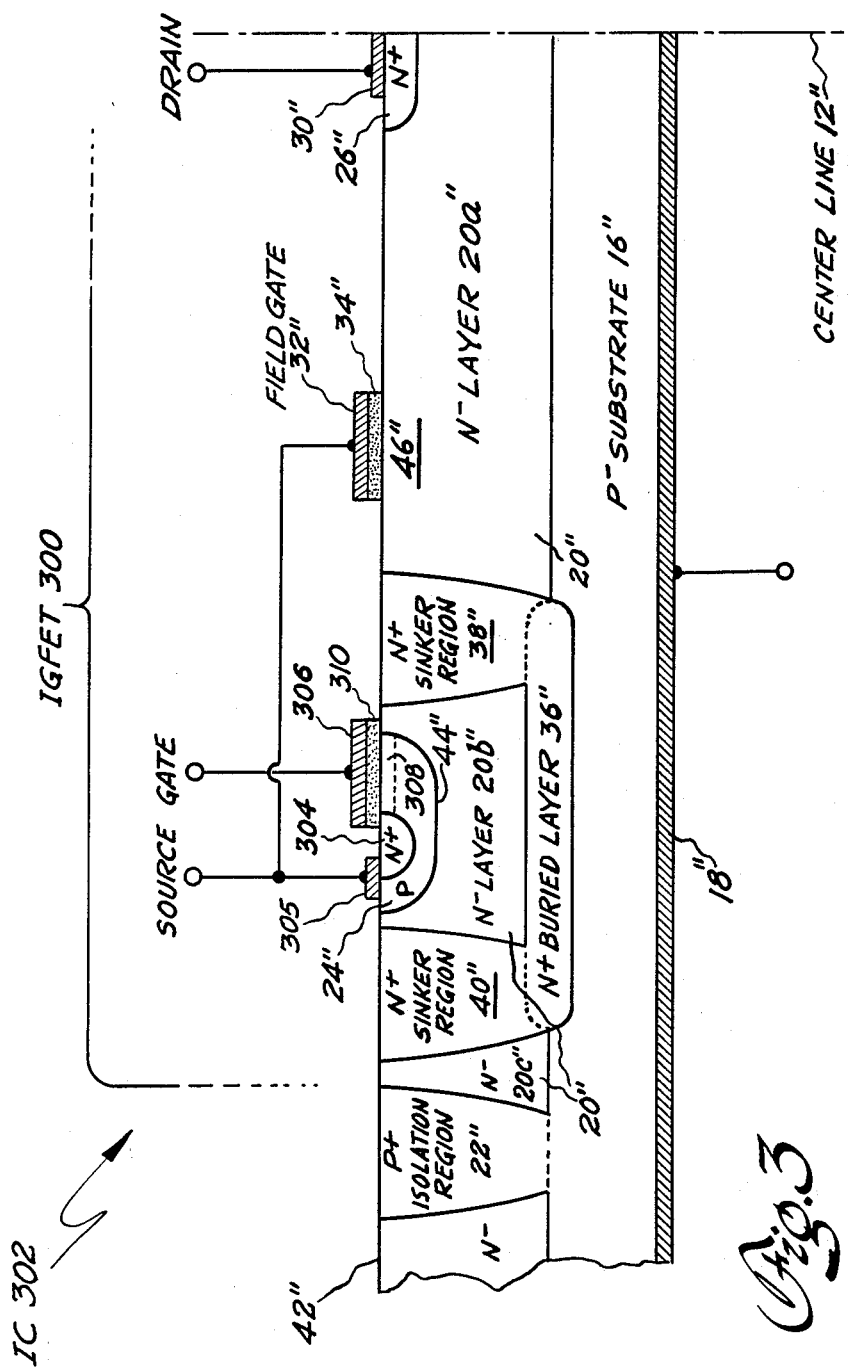

HIGH VOLTAGE INTEGRATED CIRCUIT DEVICES ELECTRICALLY ISOLATED FROM AN INTEGRATED CIRCUIT SUBSTRATE

This application is a continuation of application Ser. No. 904,735 filed 9/5/86, now abandoned which is a continuation of Ser. No. 639,042 filed 08/09/84 also abandoned.

CROSS-REFERENCE TO RELATED APPLICATION

The present application is related to commonly-assigned U.S. Pat. No. 4,494,134 filed on 1 July 1982, by E. J. Wildi and M. S. Adler (the present inventor), the entirety of which is incorporated herein by reference.

BACKGROUND AND SUMMARY OF THE INVENTION

The present invention relates to high voltage integrated circuit semiconductor devices, and more particularly to such devices that are electrically isolated from an integrated circuit substrate as well as from each other.

The above-referenced Wildi and Adler application discloses and claims an integrated circuit including a high voltage semiconductor device fabricated in a high resistivity epitaxial layer atop a high resistivity substrate of the integrated circuit, the epitaxial layer having a conductivity type opposite to that of the substrate. The high voltage device includes a first main device region of the same conductivity type as the epitaxial layer and a second main device region of the same conductivity type as the substrate, these regions being spaced apart by a portion of the epitaxial layer capable of supporting high voltage. The high voltage device is electrically isolated from other devices in the integrated circuit by an isolation region surrounding the high voltage device and adjoining the substrate. The high voltage device is electrically isolated also from the substrate through the interposition of a high conductivity buried layer of the same conductivity type as the epitaxial layer between the second main device region (of the same conductivity type as the substrate) and the substrate. The high conductivity buried layer prevents current carrier injection from the second main device region into the substrate.

Forward current conduction of the Wildi and Adler high voltage device when both the first and second main device regions are at high voltage is precluded, however, due to the inclusion in the device of a further region of the same conductivity type as the substrate, the purpose of which is to prevent the buried layer from rising dangerously high in voltage when the high voltage device is in a reverse blocking mode.

The further region of the Wildi and Adler device adjoins the epitaxial layer, so as to form a P-N junction therewith, is situated between the buried layer and the first main device region, and is electrically shorted to the substrate. In the device reverse blocking mode, current carriers from the buried layer are attracted via the epitaxial layer to the first main device region, which, in this mode, is at high voltage relative to the second main device region. Unrestrained current carrier flow from the buried layer to the first main device region would result in the buried layer voltage rising to nearly that of the first main device region, resulting in avalanche breakdown between the second main device region and the buried layer. The inclusion of the further region, however, causes pinch off of the unwanted current carrier flow in the epitaxial layer, this occurring as a result of the aforementioned P-N junction becoming highly reversed biased and inducing a depletion region in the epitaxial layer. This pinch off phenomenon is responsible, however, for preventing device forward current conduction with the second main device region also being at high voltage, since the pinch off phenomenon continues in this situation.

To avoid the foregoing pinch off phenomenon in the Wildi and Adler device when both main device regions are at high voltage, the further region may be electrically shorted to the second main device region rather than to the insulation region. This, however, would result in the further region injecting current carriers into the substrate and thereby impairing device forward conduction, since the further region would be at high voltage, rather than at ground.

It would be desirable to provide a high voltage semiconductor device of the same type as the foregoing Wildi and Adler device that is capable of unimpaired forward conduction with both main device regions at high voltage.

Accordingly, an object of the present invention is to provide a high voltage integrated circuit semiconductor device that is electrically isolated from the integrated circuit substrate while being capable of forward conduction at high voltage.

A further object of the invention is to provide a high voltage semiconductor device that may be incorporated into an integrated circuit using conventional semiconductor fabrication technology.

Briefly, in accordance with a preferred realization of the present invention, a semiconductor device is incorporated in an integrated circuit of the type including a substrate layer of one conductivity type, a drift layer of opposite conductivity type overlying the substrate layer, and an isolation region of substrate conductivity type surrounding the draft layer and adjoining the substrate layer.

The semiconductor device includes a first main device region of the opposite conductivity type extending into an upper portion of the drift layer and a second main device region of the substrate conductivity type extending into an upper portion of the drift layer and configured as a loop surrounding the first main device region at the upper surface of the drift layer. A portion of the drift region between the first and second main terminal regions supports voltage between these regions in a device reverse blocking mode. A buried layer of the opposite conductivity type is situated between the substrate and drift layers and beneath the second main device region and is configured as a loop surrounding the first main device region. That is, the projection of the buried layer on the upper surface of the drift layer surrounds the first main device region. A field gate electrode is insulatingly spaced from the drift region, is situated between the buried layer and the first main terminal region, is configured as a loop surrounding the first main terminal region, and is electrically shorted to the second main terminal region.

With the semiconductor device in a reverse blocking mode such that the first main device region is at high voltage relative to the second main device region, the field gate pinches off current carrier flow in the drift layer originating from the buried layer and attracted to the first main terminal region (at high voltage), preventing the buried layer from rising to an undesirably high voltage at which avalanche breakdown occurs between the buried layer and the second main device region.

By way of example, the semiconductor device of the invention may be of the type wherein the first and second main device regions comprise cathode and anode regions of a P-N diode, respectively; collector and base regions of a bipolar transistor, respectively; or drain and source regions of an insulated-gate field-effect transistor, respectively.

BRIEF DESCRIPTION OF THE DRAWINGS

The features of the invention deemed to be novel are defined in the appended claims. The invention itself, however, as to both organization and method of operation, together with further objects and advantages, will be better understood by reference to the following description considered in connection with the accompanying drawings figures, in which:

FIG. 1 is a schematic, cross-sectional view of an integrated circuit incorporating a high voltage P-N diode in accordance with the present invention, the view being taken to the left of a center line;

FIG. 2 is a view similar to FIG. 1 illustrating an integrated circuit incorporating a bipolar transistor in accordance with the present invention; and FIG. 3 is a view similar to FIG. 1 illustrating an integrated circuit incorporating an insulated-gate field-effect transistor in accordance with the present invention.

DESCRIPTION OF THE PREFERRED EMBODIMENTS

FIG. 1 illustrates an integrated circuit (IC) 10 that is preferably symmetrical about a center line 12. A high voltage P-N diode 14, rated at +500 volts, for example, is incorporated laterally in IC 10 in accordance with the present invention. IC 10 includes a P− (or low electrical conductivity, P-conductivity type) substrate 16 with a typical doping concentration of $5 \times 10^{13}$ dopant atoms per cubic centimeter and a substrate electrode 18 adjoining the substrate layer and typically biased to a ground or reference potential. Atop P− substrate 16 is an N− (or low electrical conductivity, N-conductivity type) layer 20 having portions 20a, 20b and 20c. Layer 20 preferable comprises a 5 to 10 micron epitaxial layer atop P− substrate 16, although layer 20 could alternatively be formed, for example, by dopant implantation into substrate 16. N− layer 20 has a typical doping concentration of $2 \times 10^{14}$ dopant atoms per cubic centimeter. Adjoining P− substrate layer 16 is P+ (or high conductivity, P-conductivity type) isolation region 22, configured as a loop surrounding P-N diode 14 so as to electrically isolate the diode from other devices (not shown) incorporated in IC 10.

P-N diode 14 includes a P+ anode region 24 extending into an upper portion of N− layer 20b and an N+ (or high electrical conductivity, N-conductivity type) cathode portion 26 extending into an upper portion of N− layer portion 20a, anode region 24 being configured as a loop surrounding cathode region 26. That is, the anode region 24 at the surface of layer 20 surrounds the cathode region 26. Anode and cathode electrodes 28 and 30, respectively, adjoin anode and cathode regions 24 and 26, respectively. Further included in P-N diode 14 is the combination of an N+ buried layer 36 and N+ sinker regions 38 and 40, which adjoin buried layer 36 so as to be at the same potential as the buried layer. N+ buried layer 36 is situated between P− substrate 16 and N− layer 20 and beneath anode region 24 and is configured as a loop surrounding cathode region 26. That is, the buried layer 36, in projection on the upper surface of layer 20 surrounds cathode region 26. N+ buried layer 36 is preferably formed through dopant implantation of N-conductivity type into P− substrate 16 prior to epitaxial growth of N− layer 20 on the substrate, although it could alternatively be formed by dopant implantation through preexisting N− layer 20. N+ buried layer 36 provides electrical isolation of P+ anode region 24 from P− substrate 16 when the anode region is at high voltage, by preventing injection of hole current carriers from the anode region into the substrate. N+ sinker region 38 extends through N− layer 20 from upper surface 42 of such layer, and is configured as a loop surrounding N+ cathode region 26. Similarly N+ sinker region 40 extends through from upper surface 38 and is configured as a loop surrounding P+ anode region 24. N+ sinker region 38, in combination with N− layer portions 20a and 20b, electrically isolated P+ anode region 24 from a field gate 32, discussed below. N+ sinker region 40, in combination with N− layer portions 20b and 20c, electrically isolated P+ anode region 24 from P+ isolation region 22. Omission of N+ sinker region 38 would increase the lateral spacing requirement $X_1$ between P+ anode region 24 and field gate 32, while omission of N+ sinker region 40 would increase the lateral spacing requirement $H_2$ between anode region 24 and P+ isolation region 22.

During forward conduction of P-N diode 14, both anode region 24 and cathode region 26 may be at high voltage (e.g., about +500 volts above the potential of substrate electrode 18), anode region 24 being slightly greater in potential than cathode region 26 (i.e., by the inherent potential of P-N junction 44 between the anode region and N− layer portion 20b). In this situation, field gate 32 does not exert a significant influence on N− layer portion 20a, since the field gate is biased at substantially the same potential as N− layer portion 20a.

The function of field gate 32 becomes realized when P-N diode 14 has a high reverse voltage across it, that is, with cathode region 26 at +500 volts, for example, and anode region 24 at a low voltage, such as +50 volts. Field gate 32, biased as it is to the low potential of P+ anode region 24, prevents N+ buried layer 36 (and adjoining N+ sinker regions 38 and 40) from rising to a dangerously high voltage, the buried layer tending to do so by yielding electrons to high voltage cathode region 26 to the point where avalanche breakdown occurs at P-N junction 44. For an IC 10 with the above-specified, typical doping levels for substrate 16 and N− layer 20, this breakdown would occur at +50 to +100 volts, substantially below the desired +500 volts for P-N diode 14. Field gate 32 prevents avalanche breakdown from occurring by pinching off portion 46 of N− layer portion 20a once the potential of buried layer 36 and sinker regions 38 and 40 reaches approximately +10 volts. This "pinch off" phenomenon results from the depletion region (not illustrated) induced in portion 46 by field gate 32, which is negatively biased with respect to N− layer portion 20a, the depletion region extending vertically throughout the entire thickness of N− layer portion 20a. The major part of the voltage between cathode region 26 and N+ buried layer 36 is predominately supported by the lateral extent of N− layer portion 20a between field gate 32 and the cathode region. Theoretical calculations using a one dimensional model with an exact solution indicate that when cathode region 30 is at +500 volts, buried layer 36 (and sinker regions 38 and 40) reach only +25 to +30 volts, which voltage range is safely within the typical breakdown voltage of P-N junction 44.

Forward conduction of P-N diode 44 is resumed by raising the potential of P+ anode region 24, by the inherent potential of P-N junction 4, over the potential of cathode region 26. When anode region 24 is thus raised in potential, field fate 32 no longer pinches off portion 46 of N− layer portion 20a since field gate 32 is then biased at substantially the same potential as N− layer portion 20a.

The concepts of the present invention may be embodied in semiconductor devices other than P-N diode 14, such as a bipolar transistor 200, depicted laterally in the FIG. 2 illustration of IC 202. Reference numerals as between IC 10 (FIG. 1) and IC 202 refer to like parts. In particular, N+ collector region 26' of IC 202 corresponds to N− cathode region 26 of IC 10, and P base region 24' of IC 202 corresponds to P+ anode region 24 of IC 10. Adjoining base region 24' in bipolar transistor 200 is an N+ emitter region 204, configured as a loop surrounding N+ collector region 26'. Base and emitter electrodes 28' and 206, respectively, adjoin base and emitter regions 24' and 204, respectively.

Field gate 32' is electrically shorted to either P base region 24 by a conductor 210 or to N+ emitter region 204 by a conductor 212 (shown in dashed lines), the emitter and base regions typically being at approximately the same potential. The function of field fate 32' in IC 202 corresponds with the above-described function of field gate 32 of IC 10. That is to say, bipolar transistor 200 may be in a forward conduction mode with base, emitter, and collector regions 24', 204 and 26', respectively, each at high voltage (about +500 volts, for example), field gate 32' in this mode not significantly interacting with N− layer portion 20a. With collector region 26' at +500 volts, for example, and base region 24' at +50 volts, for example, portion 46' of N− layer portion 20a is pinched off by field gate 32', which is biased at about +50 volts (the potential of base region 24') whereas portion 46' is biased at about +500 volts (the potential of collector region 26'). The pinched off condition of portion 46' prevents buried layer 36' (and sinker regions 38' and 40') from rising to a sufficiently high voltage as to cause avalanche breakdown of P-N junction 44'. Forward conduction of bipolar transistor 200 is commenced by biasing base region 24' to a voltage of the inherent potential of base-emitter junction 208 in excess of the potential of emitter region 204. This results in electron injection by N+ emitter region 204 into buried layer 36' and sinker regions 38' and 40', which reduces the voltage of buried layer 36' and region 38' and 40'. The voltage between field gate 32' and N− layer portion 46' is consequently reduced to the point where field gate 32' no longer pinches off N− layer portion 46', permitting electron current originating from emitter region 204 to reach collector region 26'.

A further semiconductor device in accordance with the invention is an insulated-gate field-effect transistor (IGFET) 300 depicted laterally in the FIG. 3 illustration of IC 302. Like reference numerals as between IC 302 and IC 10 (FIG. 1) refer to like parts. In particular, N+ drain region 26" of IC 302 corresponds to N+ cathode region 26 of IC 10 and P channel region 24" of IC 302 corresponds to P+ anode region 24 of IC 10. N+ source region 304 adjoins P channel region 24" and is configured as a loop surrounding drain region 26". Source electrode 305 adjoins N+ source region 304 and also P channel region 24", as is typical in an IGFET. Gate electrode 306 is insulatingly spaced from portion 308 of P channel region 24" by insulative layer 310 and extends from N+ source region 304 to N− layer portion 20b. With gate electrode 306 biased with a sufficiently high positive voltage above that of P channel region portion 308, an inversion layer is formed in portion 308, which is conductive to electrons so as to electrically interconnect N+ source region 304 and N− layer portion 20b.

With source and drain regions 304 and 26", respectively, each at high voltage, for example at about +500 volts, field gate 32" does not significantly influence N− layer portion 46", since the potential difference between field gate 32" and N− layer portion 46" is insubstantial. Forward conduction of IGFET 300 then occurs by biasing gate electrode 30 so that electrons from source region 304 flow through inversion layer 308 and thence to drain region 26". With IGFET 300 in a reverse blocking mode; drain region 26" at +500 volts, for example; and source region 24" at +50 volts, for example; buried layer 36" and sinker regions 38" and 40", which tend to rise in voltage by yielding electrons to the higher potential N− drain region 26", are limited in their voltage rise to a voltage safely below the avalanche breakdown voltage of P-N junction 44", due to pinch off of N− layer portion 46" by field gate 32". Resumption of forward conduction of IGFET 300 is then achieved by biasing gate electrode 306 to induce the formation of an inversion layer in P channel portion 308, whereupon electrons from source electrode 306 flow through inversion layer 308 and into buried layer 36" and sinker regions 38" and 40". This causes the voltage of buried layer 36" and regions 38" and 40' to fall in value so that N− layer portion 46" becomes unpinched due to the ensuing low voltage between field gate 32" and N− layer portion 46". Electrons originating from N+ source region 304 thereupon are able to reach drain region 26".

The integrated circuits described herein may be fabricated using conventional semiconductor fabrication technology as will be apparent to those skilled in the art.

In the best mode contemplated for practicing the invention, the mathematical product of thickness and doping concentration of the N− layers described herein are selected in accordance with Reduced Surface Field (RESURF) Technology so as to maxmize the reverse voltage capability of the present semiconductor devices. Details of RESURF Technology are known in the art and are contained, for example, in an article by J. A. Appels et al., entitled "High Voltage Thin Layer Devices (RESURF Devices)", *Proceedings of the* 1979 *IEEE International Electron Device Meeting*, pages 238-241, as well as in an article by S. Colak et al., entitled "Design of High-Density Power Lateral DMOS Transistors", *Proceedings of the* 1980 *IEEE Power Electronics Specialists Conference*, pages 196-197.

The foregoing describes high voltage integrated circuit devices that are electrically isolated from an integrated circuit substrate and are capable of forward conduction at high voltage. This beneficially permits incorporation into an integrated circuit of multiple high voltage devices as well as low voltage (or signal level) devices, all these devices being electrically isolated from each other and from the integrated circuit substrate. The integrated circuit devices of the invention can advantageously be made using conventional semiconductor device fabrication technology.

While the invention has been described with respect to specific embodiments, many modifications and substitutions will be apparent to those skilled in the art. For example, complementary integrated circuit devices could be fabricated, in which P-conductivity type material is used in lieu of N-conductivity type material, and vice-versa. It is, therefore, to be understood that the appended claims are intended to cover these and all such modifications and substitutions as fall within the true spirit and scope of the invention.

What is claimed as the invention and desired to be secured by Letters Patent of the United States is:

1. In an integrated circuit of the type including a first layer of one conductivity type and a drift layer of opposite conductivity type overlying said first layer, a semiconductor device included therein comprising:
    (a) a first main device region of the opposite conductivity type disposed within and extending into said drift layer from an upper surface thereof, said first main device region being more heavily doped to said opposite conductivity type than said drift layer;
    (b) an annular second main device region of said one conductivity type disposed within and extending into said drift layer from said upper surface and spaced from and surrounding said first main device region at said upper surface;
    (c) a highly-doped annular buried layer of said opposite conductivity type situated between said first and drift layers and beneath said second main device region and in projection on said upper surface of said drift layer being spaced from and surrounding said first main device region;
    (d) an annular insulated gate field electrode disposed on said drift layer where it is (1) in between and spaced from said first main device region and said second main device region; and (2) also in between said projection of said buried layer and said first main device region, said insulated gate field electrode surrounding said first main device region at said upper surface, and being electrically shorted to said second main device region; and
    (e) means for applying potentials to said first layer and said first and second main device regions;
    the region of said drift layer surrounded at said upper surface by the inner periphery of said projection of said annular buried region being free of region having said one type conductivity whereby when said first main device region assumes a potential substantially different from the potential of the second main device region of a polarity to reverse bias the junction between said second main device region and said drift layer, said insulated gate field electrode establishes a depletion region in said drift layer which extends to said first layer to prevent the flow of opposite type conductivity carriers between said buried layer and said first main device region and, when said second main device region assumes a potential which is substantially different from the potential of said first layer and said first main device region assumes a potential which is not substantially different from said potential of said second main device region, said prevention of said flow of opposite type conductivity carriers by said depletion region is avoided.

2. The semiconductor device according to claim 1 wherein:
    said first and second main device regions comprise collector and base regions of a bipolar transistor, respectively;
    said device further comprises an annular emitter region of said opposite conductivity type disposed within said base region and surrounding said collector region at said upper surface; and
    said means for applying potentials comprises means for applying potentials to said emitter region.

3. The semiconductor device accordingly to claim 1 wherein:
    said first and second device regions comprise drain and channel regions of an insulated gate field effect transistor, respectively;
    said device further comprises:
        an annular source region of said opposite type conductivity disposed within said channel region and surrounding said drain region at said upper surface, and
        an annular transistor insulated gate electrode disposed on said channel region, spaced from said insulated gate field electrode and at said upper surface surrounding said field gate electrode and said drain region; and
    said means for applying potentials comprises means for applying potentials to said source region and said transistor insulated gate electrode.

4. In an integrated circuit of the type including a substrate layer of one conductivity type semiconductor material, a drift layer of opposite conductivity type semiconductor material overlying said substrate layer, and an insolation region of said one conductivity type semiconductor material adjoining said substrate and together with said substrate surrounding said drift layer in said semiconductor material, a semiconductor device included therein comprising:
    (a) a collector region of said opposite conductivity type disposed within and extending into said drift layer from an upper surface thereof, said collector region being more heavily doped to said opposite conductivity type than said drift layer;
    (b) an annular base region of said one conductivity type disposed within and extending into said drift layer from said upper surface and configured as a loop surrounding said collector region at said upper surface;
    (c) an annular emitter region of said opposite conductivity type disposed within said base region and configured as a loop surrounding said collector region at said upper surface;
    (d) an annular highly-doped buried layer of said opposite conductivity type situated between said substrate and drift layers and beneath said base region and in projection on said upper surface surrounding said collector region;
    (e) means for applying potentials to said substrate and said collector, base and emitter regions; and
    (f) an annular insulated gate field electrode disposed on said drift layer where it is (1) in between and spaced from said base region and said collector region and (2) also in between said projection of said buried layer and said collector region, said insulated gate field electrode surrounding said collector region at said upper surface and being electrically shorted to either said emitter region or said base region;

the region of said drift layer surrounded at said upper surface by the inner periphery of said projection of said annular buried region being free of regions having said one type conductivity, whereby when said drift region assumes a potential substantially different from the potential of the base region of a polarity to reverse bias the junction between said base region and said drift region, said insulated gate field electrode establishes a depletion region in said drift layer which extends to said substrate layer to prevent the flow of opposite type conductivity carriers from said buried layer to said collector region and when said base region assumes a potential which is substantially different from the potential of said substrate and said collector region assumes a potential which is not substantially different from said potential of said base region, said prevention of said flow of opposite type conductivity carriers by said depletion region is avoided.

5. In an integrated circuit of the type including a first layer of one conductivity type and a drift layer of opposite conductivity type atop said first layer, a semiconductor device included in said integrated circuit comprising:
(a) a first region of said opposite conductivity type disposed within and extending into said drift layer from an upper surface thereof, said first region being more heavily doped to said opposite conductivity type than said drift layer;
(b) a second annular region of said one conductivity type disposed within and extending into said drift layer from said upper surface and at said upper surface surrounding said first region;
(c) a highly-doped annular buried layer of said opposite conductivity type situated between said first and drift layers and beneath said second region, the region of said drift layer between a projection of said buried region on said upper surface of said drift layer and said first region being free of regions of said one conductivity type;
(d) means for applying potentials to said first layer and said first and second regions;
(e) an annular insulated gate electrode situated atop said drift layer where it is in between and spaced from said first and second regions and also in between said first region and said projection of said buried layer on said upper surface, said insulated gate electrode being coupled to said second region for controlling the conductivity of a portion of the drift region and allowing for forward bias conduction between said first and second regions whereby when said first region assumes a potential substantially different from the potential the second region of a polarity to reverse bias the junction between said second region and said drift layer, said insulated gate electrode establishes a depletion region in said drift layer which extends to said first layer to prevent the flow of opposite type conductivity carriers from said buried layer to said first region, and when said second region assumes a potential which is substantially different from the potential of said first layer and said first region assumes a potential which is not substantially different from said potential of said second region, said prevention of said flow of opposite type conductivity carriers by said depletion region is avoided.

6. The semiconductor device according to claim 1 wherein said first and second main device regions comprise cathode and anode regions of a P-N diode, respectively.

7. The semiconductor device according to claim 1 further comprising a first highly-doped annular sinker region of said opposite conductivity type disposed within said drift layer and extending from said upper surface of said drift layer to said buried layer and surrounding said first main device region at said upper surface.

8. The semiconductor device according to claim 7 wherein said first sinker region is located in between and spaced from said second main device region and said first main device region and said device further comprises a second, highly doped, annular sinker region of said opposite conductivity type disposed within said drift layer and extending from said upper surface of said drift layer to said buried layer and surrounding said first and second main device regions and said first sinker region at said upper surface.

9. The semiconductor device according to claim 1 wherein said first layer comprises P-conductivity type semiconductor material and said drift layer comprises N-conductivity type semiconductor material.

10. The semiconductor device according to claim 9 wherein said first and drift layers each comprise silicon semiconductor material.

11. The semiconductor device according to claim 4 further comprising a first highly-doped, annular sinker region of said opposite type conductivity disposed within said drift layer and extending from said upper surface of said drift layer to said buried layer, and surrounding said collector region at said upper surface.

12. The semiconductor device according to claim 11 wherein said first sinker region is disposed in between and spaced from said base region and said collector region and said device further comprises a second, highly doped annular sinker region of said opposite type conductivity disposed within said drift layer and extending from said upper surface of said drift layer to said buried layer and surrounding said collector, base and first sinker regions at said upper surface.

13. The integrated circuit according to claim 4 wherein said substrate layer comprises P-conductivity type semiconductor material and said drift layer comprises N-conductivity type semiconductor material.

14. The integrated circuit according to claim 13 wherein said substrate and drift layers each comprise silicon semiconductor material.

15. The semiconductor device of claim 5 wherein said second region is separated from said first layer.

16. The semiconductor device of claim 5 wherein said second region is free of ohmic connections to said first layer.

17. The semiconductor device of claim 1 wherein said second main device region is separated from said first layer.

18. The semiconductor device of claim 1 wherein said second main device region is free of ohmic connections to said first layer.

19. The semiconductor device of claim 1 wherein said insulated gate field electrode is free of ohmic connections to said first layer.

20. The semiconductor device of claim 15 wherein said insulated gate electrode is free of ohmic connections to said first layer.

21. In an integrated circuit of the type including a first layer of one conductivity type and a drift layer of opposite conductivity type overlying said first layer, a semiconductor device included therein comprising:
(a) a first main device region of the opposite conductivity type disposed within and extending into said drift layer from an upper surface thereof, said first main device region being more heavily doped to said opposite conductivity type than said drift layer;
(b) an annular second main device region of said one conductivity type disposed within and extending into said drift layer from said upper surface and spaced from and surrounding said first main device region at said upper surface;
(c) a highly-doped annular buried layer of said opposite conductivity type situated between said first and drift layers and beneath said second main device region and in projection on said upper surface of said drift layer surrounding said first main device region;
(d) means for applying potentials to said first layer and said first and second main device regions; and
(e) means for preventing carrier flow between said buried layer and said first main device region when said first main device region assumes a potential substantially different from the potential of the second main device region of a polarity to reverse bias the junction between said second main device region and said drift layer, while enabling carrier flow between said second main device region and said first main device region when said second main device region assumes a potential which is substantially different from the potential of said first layer and said first main device region assumes a potential which is not substantially different from said potential of said second main device region;
said means for preventing carrier flow comprising:
an annular insulated gate field electrode disposed on said drift layer where it is (1) in between and spaced from said first main device region and said second main device region; and (2) also in between said projection of said buried layer and said first main device region, said insulated gate field electrode surrounding said first main device region at said upper surface, and being electrically shorted to said second main device region; and
the region of said drift layer surrounded at said upper surface by the inner periphery of said projection of said annular buried region being free of regions having said one type conductivity.

22. In an integrated circuit of the type including a first layer of one conductivity type and a drift layer of opposite conductivity type overlaying said first layer, a semiconductor device included therein comprising:
(a) a first main device region of the opposite conductivity type disposed within and extending into said drift layer from an upper surface thereof, said first main device region being more heavily doped to said opposite conductivity type than said drift layer;
(b) an annular second main device region of said one conductivity type disposed within and extending into said drift layer from said upper surface and spaced from and surrounding said first main device region at said upper surface;
(c) a highly-doped annular buried layer of said opposite conductivity type situated between said first and drift layers and beneath said second main device region and in projection on said upper surface of said drift layer surrounding said first main device region;
(d) means for applying potentials to said first layer and said first and second main device regions; and
(e) means for preventing carrier flow between said buried layer and said first main device region when said first main device region assumes a potential substantially different from the potential of the second main device region of a polarity to reverse bias the junction between said second main device region and said drift layer, while enabling carrier flow between said second main device region and said first main device region when said second main device region assumes a potential which is substantially different from the potential of said first layer and said first main device region assumes a potential which is not substantially different from said potential of said second main device region;
said means for preventing flow comprising:
an annular insulated gate field electrode disposed on said drift layer where it is (1) in between and spaced from said first main device region and said second main device region; and (2) also in between said projection of said buried layer and said first main device region, said insulated gate field electrode surrounding said first device region at said upper surface, and being electrically shorted to said second main device region; and
the region of said drift layer surrounded at said upper surface by the outer periphery of said annular insulated gate field electrode being free of regions having said one type conductivity.

* * * * *